United States Patent [19]

Miyamoto et al.

[11] Patent Number: 4,780,850
[45] Date of Patent: Oct. 25, 1988

[54] CMOS DYNAMIC RANDOM ACCESS MEMORY

[75] Inventors: Hiroshi Miyamoto; Shigeru Mori; Michihiro Yamada; Tadato Yamagata, all of Hyogo, Japan

[73] Assignee: Mitsubishi Denki Kabushiki Kaisha, Tokyo, Japan

[21] Appl. No.: 116,285

[22] Filed: Nov. 2, 1987

[30] Foreign Application Priority Data

| Oct. 31, 1986 [JP] | Japan | 61-261615 |
| Oct. 31, 1986 [JP] | Japan | 61-261616 |
| Dec. 1, 1986 [JP] | Japan | 61-287332 |
| Feb. 12, 1987 [JP] | Japan | 62-30011 |

[51] Int. Cl.$^4$ ............................................. G11C 7/00
[52] U.S. Cl. ..................................... 365/189; 365/149; 365/203; 365/205; 365/208
[58] Field of Search .............. 365/149, 189, 203, 205, 365/208

[56] References Cited

U.S. PATENT DOCUMENTS

| 4,085,457 | 4/1978 | Itoh | 365/205 |
| 4,539,658 | 9/1985 | Shimohigashi et al. | 365/203 |
| 4,559,619 | 12/1985 | Ikeda | 365/203 |
| 4,564,925 | 1/1986 | Onishi et al. | 365/189 |

FOREIGN PATENT DOCUMENTS 0082279 5/1982 Japan .
0035795 3/1983 Japan .
011393 3/1985 Japan .

OTHER PUBLICATIONS

National Telecommunication Conference, 1982, Lecture No. 439, "Study on Sense Amplifier Driving Signal".
IEEE, ISSCC, "1 Mb CMOS DRAM with Fast Page & Static Column Modes", ISSCC 85, 1985, pp. 252-253, 2-15-85, by Shozo Saito et al.

Primary Examiner—James W. Moffitt
Attorney, Agent, or Firm—Lowe, Price, LeBlanc, Becker & Shur

[57] ABSTRACT

A dynamic random access memory comprises N channel sense amplifiers, P channel sense amplifiers and an equalizing MOSFET each provided for each of bit line pairs. The N channel sense amplifiers and the P channel sense amplifiers are operated by sense amplifier driving signals. In each of the N channel sense amplifiers, an MOSFET is connected between one of bit lines and an interconnection for transmitting a sense amplifier driving signal. In addition, a precharge potential generating circuit for generating a potential of $(\frac{1}{2})V_{CC}$ is connected to the interconnection for transmitting the sense amplifier driving signal through a MOSFET. The bit line pairs are equalized by the equalizing MOSFET. Then, in each of the N channel sense amplifiers, the above described interconnection and one of the bit lines are connected to each other, and the above described interconnection and the precharge potential generating circuit are connected to each other. Therefore, the potentials on the bit line pairs and the above described interconnection are held at $(\frac{1}{2})V_{CC}$.

16 Claims, 13 Drawing Sheets

CMOS DYNAMIC RANDOM ACCESS MEMORY

BACKGROUND OF THE INVENTION

1. Field of the Invention

The present invention relates to a dynamic random access memory (referred to as a DRAM hereinafter) and more particularly, to a CMOS (Complementary Metal Oxide Semiconductor) DRAM using a system of precharging a bit line to be $(\frac{1}{2})V_{CC}$.

2. Description of the Prior Art

FIG. 1 is a diagram showing a structure of a conventional CMOS·DRAM, and FIG. 2 is a schematic circuit diagram showing a main portion of FIG. 1.

Referring to FIG. 1, a plurality of word lines WL1 to WLm and a plurality of pairs of bit lines BL1 and $\overline{BL1}$ to BLn and $\overline{BLn}$ are arranged to intersect with each other, memory cells M being provided at intersections thereof.

The word lines WL1 to WLm are connected to a row decoder 5. The row decoder 5 is responsive to an applied row address signal for applying a selecting signal at a high level to any of the word lines WL1 to WLm. The bit line pairs BL1 and $\overline{BL1}$ to BLn and $\overline{BLn}$ are connected to input/output lines I/O and $\overline{I/O}$ through MOSFETs Q8 and Q9, respectively. Each of the transistors Q8 and Q9 has a gate connected to a column decoder 6. The column decoder 6 is responsive to an applied column address signal for applying column address selecting signals Y1 to Yn to the gates of the corresponding transistors Q8 and Q9. An N channel sense amplifier 1, a P channel sense amplifier 2, an equalizing circuit 3 and a precharge potential holding circuit 4 are connected to each of the bit line pairs BL1 and $\overline{BL1}$ to BLn and $\overline{BLn}$.

FIG. 2 is a schematic circuit diagram showing a portion of one of the bit line pairs BL and $\overline{BL}$, which is disclosed in Digest of Technical Papers pp. 252-253 in International Solid-State Circuits Conference, 1985 (ISSCC '85).

Referring to FIG. 2, an N channel sense amplifier 1 comprises N channel MOSFETs (Metal Oxide Semiconductor Field Effect Transistors) Q1 and Q2. A P channel sense amplifier 2 comprises P channel MOSFETs Q3 and Q4. Each of the FETs Q1 and Q3 has a drain connected to a bit line BLj, and each of the FET Q2 and Q4 has a drain connected to a bit line $\overline{BLj}$. Each of the FETs Q1 and Q3 has a gate connected to a bit line $\overline{BLj}$, and each of the FETs Q2 and Q4 has a gate connected to a bit line BLj. Each of the FETs Q1 and Q2 has a source connected to a grounding conductor of a potential $V_{SS}$ through a line $L_N$ and a sense amplifier driving N channel MOSFET $Q_{SN}$. The FET $Q_{SN}$ has a gate receiving a sense amplifier triggering signal $S_N$. The line $L_N$ transmits a sense amplifier driving signal $\phi_N$. Each of the FETs Q3 and Q4 has a source connected to a power supply line $V_P$ of the potential $V_{CC}$ through a line $L_P$ and a sense amplifier driving P channel MOSFET $Q_{SP}$. The FET $Q_{SP}$ has a gate receiving a sense amplifier triggering signal $S_P$. The line $L_P$ transmits a sense amplifier driving signal $\phi_P$.

A memory cell M comprises an FET $Q_S$ and a capacitor $C_S$. The capacitor $C_S$ is connected to the bit line BLj through the FET $Q_S$. The FET $Q_S$ has a gate connected to a word line WLi.

An equalizing circuit 3 comprises an FET Q5 connected between the bit line BLj and the bit line $\overline{BLj}$. The FET Q5 has a gate connected to a line $L_Q$ for applying an equalize signal EQ.

A precharge potential holding circuit 4 comprises FETs Q6 and Q7 connected in series between the bit lines BLj and $\overline{BLj}$. A line $L_{BL}$ for applying a bit line precharging potential $V_{BL}$ is connected to a node of the FETs Q6 and Q7. The bit line precharging potential is generally selected to be an intermediate potential between the power supply potential $V_{CC}$ and the ground potential $V_{SS}$, i.e., $(\frac{1}{2})V_{CC}$.

Furthermore, the bit lines BLj and $\overline{BLj}$ are connected to input/output lines I/O and $\overline{I/O}$ through transferring FETs Q8 and Q9, respectively. Each of the FETs Q8 and Q9 has a gate receiving a column address selecting signal Yj.

Referring now to FIG. 2 and FIG. 3 of a waveform diagram for explaining operation, description is made on operation of the above described DRAM. It is assumed that the content stored in the capacitor $C_S$ is "1".

In FIG. 3, when an external $\overline{RAS}$ signal (Ext.$\overline{RAS}$) falls, the DRAM is rendered active, so that an external row address signal is latched in a chip. Then, the equalize signal EQ attains a low level. Therefore, equalizing of the bit lines BL and $\overline{BL}$ is stopped and the line $L_{BL}$ receiving the bit line precharging potential $V_{BL}$ and the bit lines BL and $\overline{BL}$ are disconnected.

Then, the potential on a word line selected in response to the row address signal latched in the chip attains a high level. It is assumed that the word line WLi shown in FIG. 2 is selected. When the potential on the word line WLi attains a high level, the FET $Q_S$ is turned on, so that charges stored in the capacitor $C_S$ are transferred to the bit line BLj. As a result, the potential on the bit line BLj is higher than the potential on the bit line at the time of equalizing, that is, the bit line precharging potential $V_{BL}$. Then, when the sense amplifier triggering signal $S_N$ attains a high level and the sense amplifier triggering signal $S_P$ attains a low level, the FETs $Q_{SN}$ and $Q_{SP}$ are turned on. As a result, the sense amplifier driving signal $\phi_N$ attains a low level and the sense amplifier driving signal $\phi_P$ attains a high level. Therefore, the N channel sense amplifier (the first sense amplifier) 1 and the P channel sense amplifier (the second sense amplifier) 2 operate, so that the potential difference between the bit lines BLj and $\overline{BLj}$ is amplified. As a result, the content "1" stored in the capacitor $C_S$ is read out to the bit line BLj.

Then, the column address selecting signal attains a high level. When the bit lines BLj and $\overline{BLj}$ are selected, the column address signal Yj attains a high level, so that data on the bit lines BLj and $\overline{BLj}$ are transferred to the input/output lines I/O and $\overline{I/O}$ through the transferring FETs Q8 and Q9, respectively.

Then, the DRAM is rendered inactive in response to the rise of the external $\overline{RAS}$ signal. The external $\overline{RAS}$ signal attains a high level and then, the potential on the selected word line WLi attains a low level, so that the FET $Q_S$ is turned off. Then, the sense amplifier triggering signal $S_N$ attains a low level and the sense amplifier triggering signal $S_P$ attains a high level. Then, the equalize signal EQ attains a high level. As a result, the bit lines BLj and $\overline{BLj}$ are equalized, so that the potentials thereon become $(\frac{1}{2})V_{CC}$. At the same time, the line $L_{BL}$ receiving the precharge potential $V_{BL}$ is connected to the bit lines BLj and $\overline{BLj}$, so that the potentials on the bit lines BLj and $\overline{BLj}$ are held at $(\frac{1}{2})V_{CC}$. At that time, the sense amplifier driving signal $\phi_N$ is changed from a low level to an intermediate level, and the sense amplifier driving signal $\phi_P$ is changed from a high level to an intermediate level.

As described in the foregoing, in the CMOS dynamic sense amplifier included in the conventional DRAM, the bit lines are connected to the line $L_{BL}$ receiving the bit line precharge potential $V_{BL}$, so as to prevent the bit line precharging potential from varying due to leak current or the like caused during the inactive state of the DRAM. In addition, according to the above described conventional example, the sense amplifier driving signals $\phi_N$ and $\phi_S$ are held at the bit line precharging potential $V_{BL}$. Therefore, the sense amplifier driving signals $\phi_N$ and $\phi_S$ are held at the same potential as those on the bit lines.

However, in a structure of the conventional DRAM shown in FIG. 1, many bit line pairs, sense amplifiers and the like are arranged in a chip of the DRAM. Since the bit line precharging potential $V_{BL}$ and the sense amplifier driving signals $\phi_N$ and $\phi_P$ are shared with many bit line pairs and the sense amplifiers, the interconnection lengths for the bit line precharging potential $V_{BL}$ and the sense amplifier driving signals $\phi_N$ and $\phi_P$ are increased. Thus, as described above, if and when the bit lines BLj and $\overline{BL}$j and the lines $L_N$ and $L_P$ for transmitting the sense amplifier driving signals $\phi_N$ and $\phi_P$ are connected to the line $L_{BL}$ for applying the precharge potential $V_{BL}$, outside a portion having many bit line pairs, sense amplifiers and the like arranged (referred to as an array portion hereinafter), the line $L_{BL}$ and the lines $L_N$ and $L_P$ intersect with the other many interconnections. As a result, the lines $L_{BL}$, $L_N$ and $L_P$ are liable to be affected by noise due to capacitive coupling between the lines and the interconnections. More particularly, as shown in FIG. 1, when the line $L_{BL}$ and the lines $L_N$ and $L_P$ are arranged spaced apart from each other, the interconnections are affected by noises having different phases more increasingly.

Furthermore, if and when the potential of the N channel sense amplifier driving signal $\phi_N$ is decreased due to such noise, as compared with the potential which is lower, by a threshold voltage of the N channel FET, than the precharge potential on the bit line, or is increased due to such noise, as compared with the potential which is higher, by the absolute value of a threshold voltage of the P channel FET, than the precharge potential on the bit line, the activation of the sense amplifiers is unnecessarily hastened, and the sensitivity of the sense amplifiers is liable to be deteriorated due to variation in characteristics of transistors constituting each of the sense amplifiers, which is described in, for example, National Telecommunication Conference, 1982, Lecture Number 439.

A method for solving a part of the problems is disclosed in, for example, Japanese Patent Publication No. 11393/1985, which is shown in FIG. 4.

FIG. 4 illustrates a sense amplifier portion comprising only N channel transistors. In addition to FETs Q41 and Q42 constituting the sense amplifier, FETs Q43 and Q44 are connected between the bit lines BL and $\overline{BL}$ and a line $L_N$ for applying a sense amplifier driving signal $\phi_N$. Each of the FETs Q43 and Q44 has a gate receiving a sense amplifier pull-up signal $\phi_1$. The line $L_N$ is connected to potentials $V_1$ and $V_2$ through sense amplifier activating FETs Q47 and Q48. The FETs Q47 and Q48 have gates receiving sense amplifier triggering signals $S_{N1}$ and $S_{N2}$, respectively. The bit lines BL and $\overline{BL}$ are connected to a power supply potential $V_{CC}$ through precharging FETs Q45 and Q46, respectively.

Since the above described FETs Q43 and Q44 cause the bit lines BL and $\overline{BL}$ and the sense amplifier driving signal $\phi_N$ to be the same potential in the vicinity of the sense amplifier while the DRAM is rendered inactive, the above described problem of activating the sense amplifier too early is avoided.

As shown in FIG. 4, if and when the sense amplifier portion comprises only the N channel transistors, the bit lines are precharged to be the power supply potential $V_{CC}$. Since the precharging FETs Q45 and Q46 are generally provided for each sense amplifier, an interconnection for applying the power supply potential $V_{CC}$ is necessarily arranged in the array portion. In the case of a CMOS sense amplifier, since an interconnection for applying a bit line precharging potential $V_{BL}$ must be arranged in the array portion by some method, there occurs the above described problem due to noise.

Furthermore, Japanese Patent Laying-Open Gazette No. 82279/1982 discloses a semiconductor memory device in which a precharge potential $V_{CC}$ is applied to bit line pairs through a line for applying a driving signal to an N channel sense amplifier. In the semiconductor memory device, the line for applying the sense amplifier driving signal is connected to the power supply potential $V_{CC}$ through an N channel MOSFET. However, in the semiconductor memory device, since the sense amplifier is of an N channel type and the precharge potential is $V_{CC}$, the potential which is higher, by at least a threshold voltage $V_{TH}$ of the N channel MOSFET, than the power supply potential $V_{CC}$ must be applied to a gate of the N channel MOSFET connected between the power supply potential $V_{CC}$ and the above described line. In addition, since the potential on the bit line pair which became a potential $(\frac{1}{2})V_{CC}$ by short-circuiting the bit line pair must be increased to the power supply potential $V_{CC}$, the semiconductor memory device consumes much power.

SUMMARY OF THE INVENTION

A primary object of the present invention is to provide a dynamic random access memory comprising a CMOS sense amplifier and bit lines having high sensitivity which are not affected by variation in manufacturing processes and internal noise.

In order to attain the above described object, the dynamic random access memory according to the present invention comprises a plurality of word lines; a plurality of bit line pairs arranged to intersect with the word lines; a plurality of memory cells provided at intersections of the word lines and the bit lines; equalize signal generating means for generating an equalize signal commanding equalizing of the plurality of bit line pairs; a plurality of equalizing means each provided for each of the bit line pairs and responsive to the equalize signal for equalizing each of the bit line pairs; a plurality of first sense amplifiers each connected to each of the bit line pairs for amplifying the potential difference between the bit line pair, each of the first sense amplifiers comprising a first N channel FET and a second N channel FET; first sense amplifier driving signal generating means for generating a first sense amplifier driving signal for driving the first sense amplifiers, the first sense amplifiers being operated in response to the first sense amplifier driving signal; a plurality of second sense amplifiers each connected to each of the bit line pairs for amplifying the potential difference between the bit line pair, each of the second sense amplifiers comprising a first P channel FET and a second P channel FET;

second sense amplifier driving signal generating means for generating a second sense amplifier driving signal for driving the second sense amplifiers, the second sense amplifiers being operated in response to the second sense amplifier driving signal; a first driving signal line connected to the first sense amplifiers so that the first sense amplifier driving signal is applied to the first sense amplifiers through the first driving signal line; a second driving signal line connected to the second sense amplifiers so that the second sense amplifier driving signal is applied to the second sense amplifiers through the second driving signal line; connecting means each provided for each of the bit line pairs for connecting at least one of the bit line pair to at least one of the first driving signal line and the second driving signal line; activating signal generating means for generating an activating signal for activating the connecting means, the connecting means being operated in response to the activating signal; a first potential source for generating a first potential corresponding to a first logical level; a second potential source for generating a second potential corresponding to a second logical level; and potential holding means for holding the potentials on the first driving signal line and the second driving signal line at an intermediate potential between the first potential and the second potential.

In the dynamic random access memory according to the present invention, the potentials on each of the bit line pairs and the sense amplifier driving signal lines are made to be the same potential in each of the sense amplifier portions, and each of the bit line pairs is held at an intermediate potential between the first potential and the second potential through each of the sense amplifier driving signal lines. Therefore, even if the bit lines are affected by noise, the sense amplifiers do not erroneously operate, so that the high sensitivity thereof is ensured. In addition, since an interconnection for holding each of the bit line pairs at the intermediate potential between the first potential and the second potential need not be added, the chip size is not so increased.

A principal advantage of the dynamic random access memory according to the present invention is that there are provided CMOS sense amplifiers having large operating margin relative to internal noise and variation in manufacturing processes without increasing the chip size.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
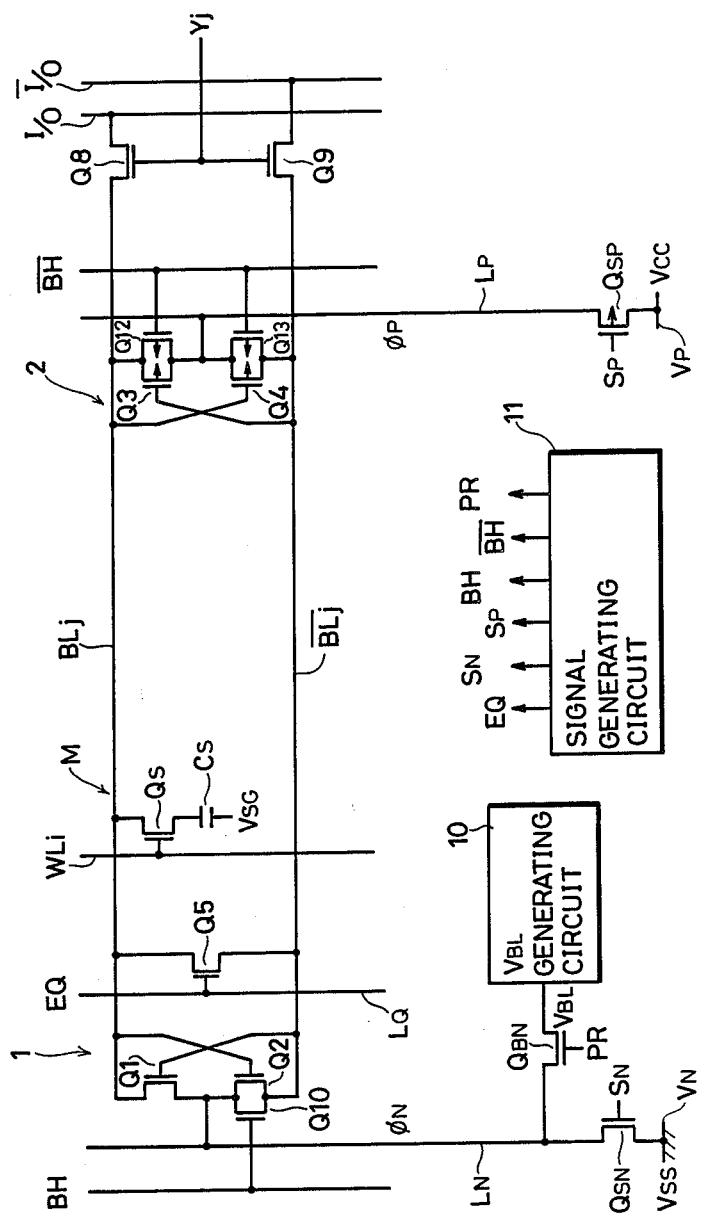
FIG. 5 is a circuit diagram showing a dynamic random access memory according to an embodiment of the present invention, where a portion of a pair of bit lines and a pair of CMOS sense amplifiers is mainly illustrated.

FIG. 5 is a circuit diagram showing a main portion of a dynamic random access memory according to an embodiment of the present invention. Referring to FIG. 5, description is made on a structure of the present embodiment.

In FIG. 5, a pair of bit lines and a pair of CMOS sense amplifiers comprising an N channel sense amplifier 1 and a P channel sense amplifier 2 are illustrated. The dynamic random access memory according to the present embodiment is the same as the conventional dynamic random access memory, except for the following. In FIG. 5, the N channel sense amplifier 1 and the P channel sense amplifier 2 are arranged spaced apart from each other.

The N channel sense amplifier 1 comprises N channel MOSFETs Q1 and Q2. The FET Q1 has a drain connected to a bit line BLj, and the FET Q2 has a drain connected to a bit line $\overline{BLj}$. The FET Q1 has a gate connected to the bit line $\overline{BLj}$, and the FET Q2 has a gate connected to the bit line BLj. Each of the FETs Q1 and Q2 has a source connected to a line $L_N$ for transmitting a sense amplifier driving signal $\phi_N$. The line $L_N$ is connected to a grounding conductor $V_N$ of a potential $V_{SS}$ through a sense amplifier driving N channel MOSFET $Q_{SN}$. The FET $Q_{SN}$ has a gate receiving a sense amplifier triggering signal $S_N$.

The P channel sense amplifier 2 comprises P channel MOSFETs Q3 and Q4. The FET Q3 has a drain connected to the bit line BLj, and the FET Q4 has a drain connected to the bit line $\overline{BLj}$. The FET Q3 has a gate connected to the bit line $\overline{BLj}$, and the FET Q4 has a gate connected to the bit line BLj. Each of the FETs Q3 and Q4 has a source connected to a line $L_P$ for transmitting a sense amplifier driving signal $\phi_P$. The line $L_P$ is connected to a power supply line $V_P$ of a potential $V_{CC}$ through a sense amplifier driving P channel MOSFET $Q_{SP}$. The FET $Q_{SP}$ has a gate receiving a sense amplifier triggering signal $S_P$.

A memory cell M comprises an FET $Q_S$ and a capacitor $C_S$. The capacitor $C_S$ is connected to the bit line BLj through the FET $Q_S$. The FET $Q_S$ has a gate connected to a word line WLi. In FIG. 5, only a single memory cell M is illustrated.

An equalizing circuit 3 comprises an FET Q5 connected between the bit lines BLj and $\overline{BLj}$. The FET Q5 has a gate connected to a line $L_Q$ for applying an equalize signal EQ.

The bit lines BLj and $\overline{BLj}$ are connected to the input/output lines I/O and $\overline{I/O}$ through transferring FETs Q8 and Q9, respectively. Each of the FETs Q8 and Q9 has a gate receiving a column address selecting signal Yj.

The embodiment shown in FIG. 5 is characterized as follows. In the N channel sense amplifier 1, an N channel MOSFET Q10 for causing the bit line $\overline{BLj}$ and the line $L_N$ to be the same potential is connected therebetween. The FET Q10 has a gate receiving a sense amplifier pull-up signal BH. In addition, a precharge potential generating circuit (referred to as a $V_{BL}$ generating circuit hereinafter) 10 is connected to the line $L_N$ through an N channel MOSFET $Q_{BN}$. The FET $Q_{BN}$ has a gate receiving a precharge signal PR. The $V_{BL}$ generating circuit 10 generates an intermediate potential between the power supply potential $V_{CC}$ and the ground potential $V_{SS}$, that is, a precharge potential $V_{BL}$ of $(\frac{1}{2})V_{CC}$. Furthermore, in the P channel sense amplifier 2, a P channel MOSFET Q12 for causing the bit line BLj and the line $L_P$ to be the same potential is connected therebetween. A P channel MOSFET Q13 for causing the bit line $\overline{BLj}$ and the line $L_P$ to be the same potential is connected therebetween. Each of the FETs Q12 and Q13 has a gate receiving an inverted signal $\overline{BH}$ of the above described sense amplifier pull-up signal BH.

A signal generating circuit 11 generates the equalize signal EQ, the sense amplifier triggering signals $S_N$ and $S_P$, the sense amplifier pull-up signal BH, the inverted signal $\overline{BH}$ and the precharge signal PR at predetermined timings.

Figure 6:
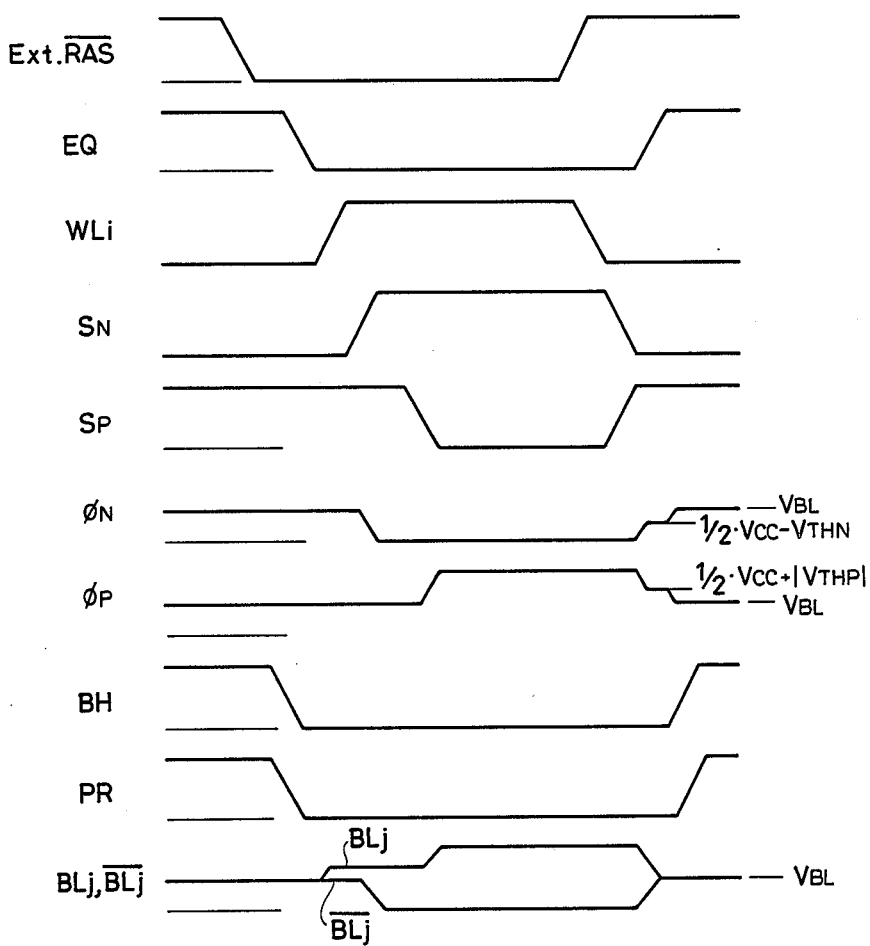
FIG. 6 is a waveform diagram of signals for explaining operation of the circuit shown in FIG. 5.

Referring now to FIG. 5 and FIG. 6 of a waveform diagram for explaining operation, description is made on operation of the above described DRAM. It is assumed that the content stored in the capacitor $C_S$ is "1".

In FIG. 6, when an external $\overline{RAS}$ signal (Ext.$\overline{RAS}$) falls, the DRAM is rendered active, so that an external row address signal is latched in a chip. Then, the equalize signal EQ, the sense amplifier pull-up signal BH and the precharge signal PR attain a low level.

Then, the potential on a word line selected in response to the row address signal latched in the chip attains a high level. It is assumed that the word line WLi shown in FIG. 5 is selected. When the potential on the word line WLi attains a high level, the FET $Q_S$ is turned on, so that charges stored in the capacitor $C_S$ is transferred to the bit line BLj. As a result, the potential on the bit line BLj is higher than the potential on the bit line at the time of equalizing, that is, a bit line precharging potential $V_{BL}$. Then, when the sense amplifier triggering signal $S_N$ attains a high level and the sense amplifier triggering signal $S_P$ attains a low level, the FETs $Q_{SN}$ and $Q_{SP}$ are turned on. As a result, the sense amplifier driving signal $\phi_N$ attains a low level and the sense amplifier driving signal $\phi_P$ attains a high level. Therefore, since the N channel sense amplifier (the first sense amplifier) 1 and the P channel sense amplifier (the second sense amplifier) 2 operate, the potential difference between the bit lines BLj and $\overline{BLj}$ is amplified, so that the potential on the bit line BLj becomes $V_{CC}$ and the potential on the bit line $\overline{BLj}$ becomes $V_{SS}$. Then, a column address selecting signal attains a high level. If and when the bit lines BLj and $\overline{BLj}$ are selected, the column address signal Yj attains a high level, so that data on the bit lines BLj and $\overline{BLj}$ are transferred to the input/output lines I/O and $\overline{I/O}$ through the transferring FETs Q8 and Q9, respectively.

Then, the DRAM is rendered inactive in response to the rise of the external $\overline{RAS}$ signal. The external $\overline{RAS}$ signal attains a high level and then, the potential on the selected word line WLi attains a low level, so that the FET $Q_S$ is turned off. Then, the sense amplifier triggering signal $S_N$ attains a low level and the sense amplifier triggering signal $S_P$ attains a high level. Then, the equalize signal EQ attains a high level. As a result, the bit lines BLj and $\overline{BLj}$ are equalized and the potentials thereon become $(\frac{1}{2})V_{CC}$. At that time, the line $L_N$ for transferring the sense amplifier driving signal $\phi_N$ is precharged to be $(\frac{1}{2})V_{CC}-V_{THN}$ through the FETs Q1 and Q2, and a line $L_P$ for transferring the sense amplifier driving signal $\phi_P$ is precharged to be $(\frac{1}{2})V_{CC}+|V_{THP}|$ through the FETs Q3 and Q4, where $V_{THN}$ and $V_{THP}$ are threshold voltages of the N channel MOSFET and the P channel MOSFET, respectively.

Then, when the sense amplifier pull-up signal BH attains a high level, the line $L_N$ for transferring the sense amplifier driving signal $\phi_N$ is precharged to be $(\frac{1}{2})V_{CC}$ through the FET Q10. At the same time, since the inverted signal $\overline{BH}$ attains a low level, the FETs Q12 and Q13 are turned on, so that the line $L_P$ for transmitting the sense amplifier driving signal $\phi_P$ is precharged to be $(\frac{1}{2})V_{CC}$ through the FETs Q12 and Q13. In addition, the precharge signal PR attains a high level, so that the $V_{BL}$ generating circuit 10 is connected to the line $L_N$. Therefore, the sense amplifier driving signal $\phi_N$ is held at the precharge potential $V_{BL}$, i.e., $(\frac{1}{2})V_{CC}$. At that time, the precharge potential $V_{BL}$ is supplied to the bit line BLj through the FET Q10. Furthermore, since bit lines BLj and $\overline{BLj}$ are connected to each other by the FET Q5, the precharge potential $V_{BL}$ is also supplied to the bit line $\overline{BLj}$. Additionally, since the line $L_P$ is connected to the bit lines BLj and $\overline{BLj}$ by the FETs Q12 and Q13, the sense amplifier driving signal $\phi_P$ is held at the precharge potential $V_{BL}$.

Thus, even if the potentials on the bit lines vary due to noise in this state, the potentials on the bit lines and the sense amplifier driving signals become the same potential by the transistors Q10, Q12 and Q13 each provided for each sense amplifier, so that the problems of too early sensing operation and deterioration of sensitivity of the sense amplifiers can be solved without increasing the chip size.

Figure 1:
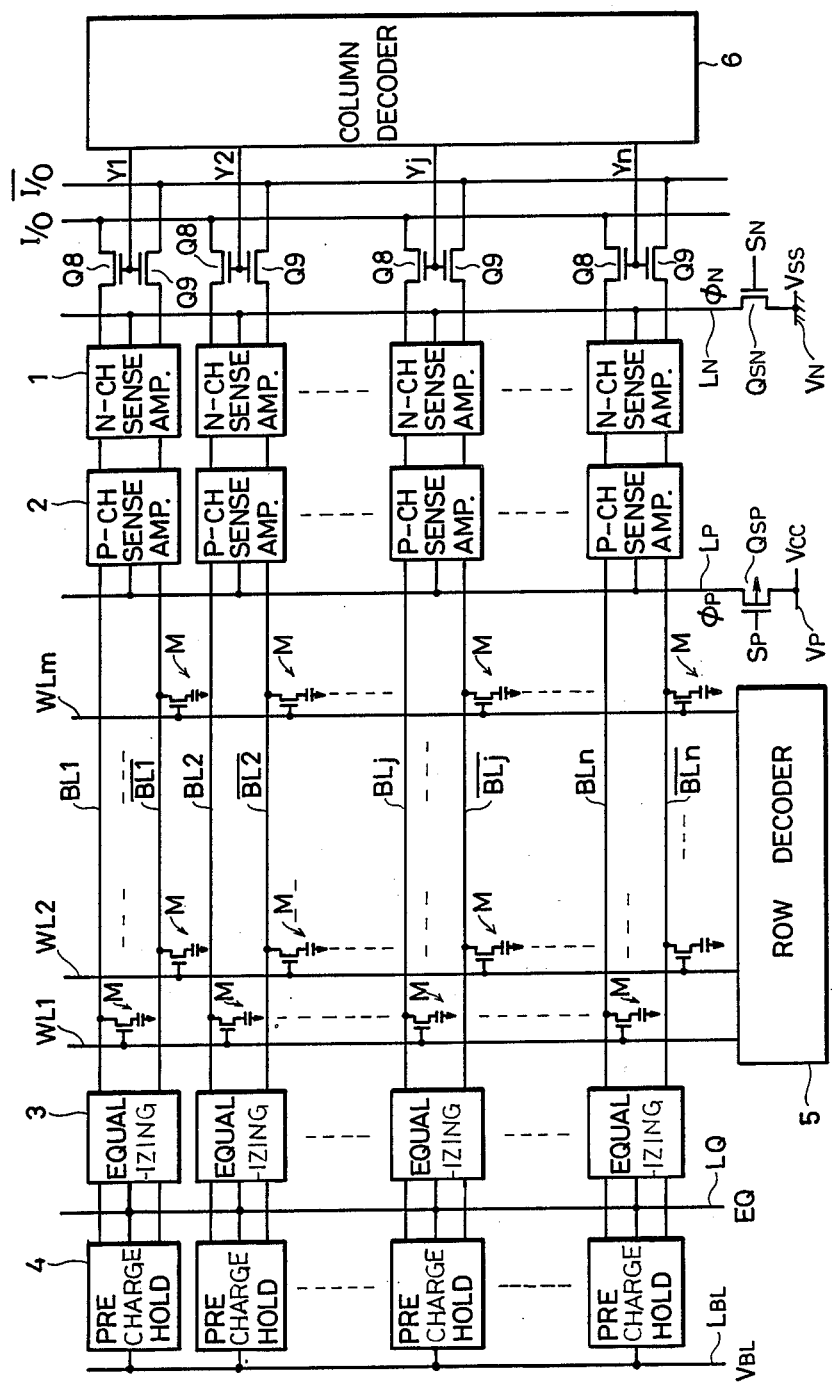
FIG. 1 is a circuit diagram showing a structure of a conventional dynamic random access memory.
Figure 2:
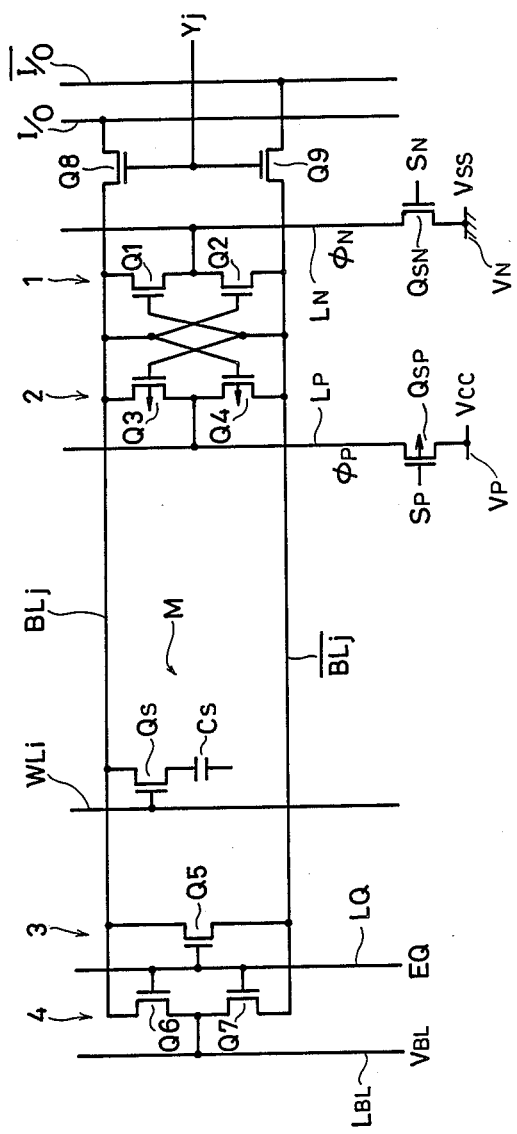
FIG. 2 is a circuit diagram showing schematically a main portion in the conventional dynamic random access memory, where a portion of a pair of bit lines and a pair of CMOS sense amplifiers is mainly illustrated.
Figure 3:
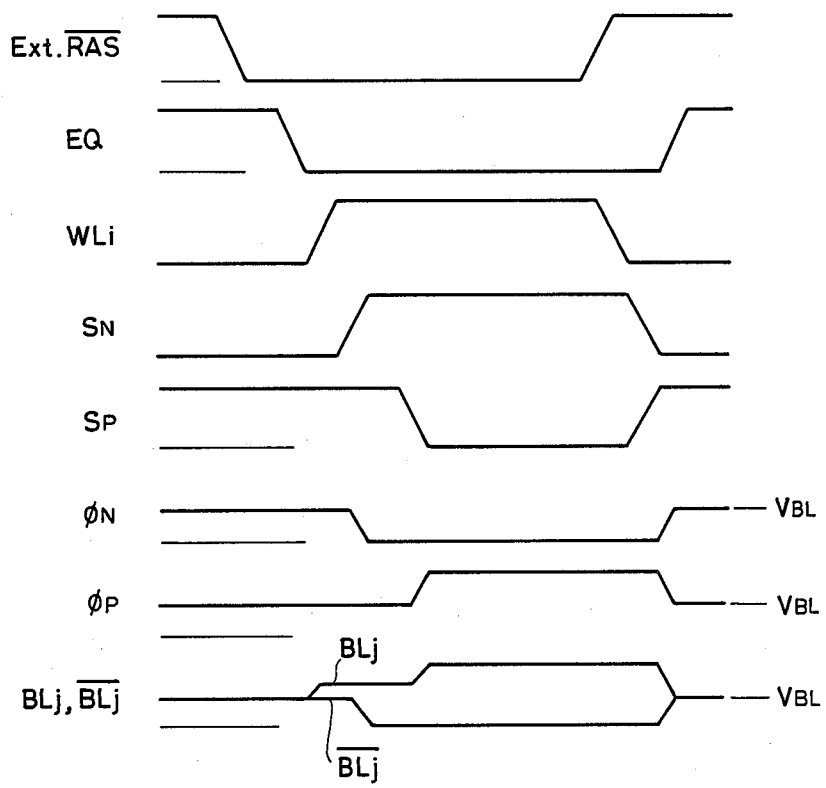
FIG. 3 is a waveform diagram of signals for explaining operation of the circuit shown in FIG. 2.
Figure 4:
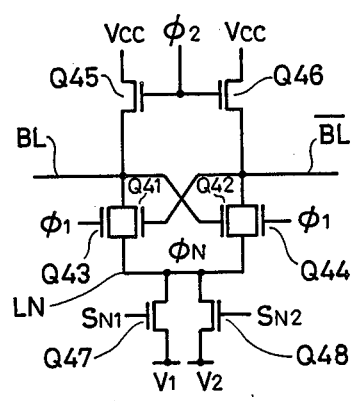
FIG. 4 is a circuit diagram showing a bit line pair and an NMOS sense amplifier in another conventional dynamic random access memory.

In the conventional DRAM shown in FIG. 2, three MOSFETs Q5, Q6 and Q7 are required to precharge a pair of bit lines BLj and $\overline{BLj}$. However, in the embodiment shown in FIG. 6, the precharge potential $V_{BL}$ can be supplied to the bit line pair BLj and $\overline{BLj}$ by the two MOSFETs Q5 and Q10, so that increase in chip size can be minimized.

Figure 7:
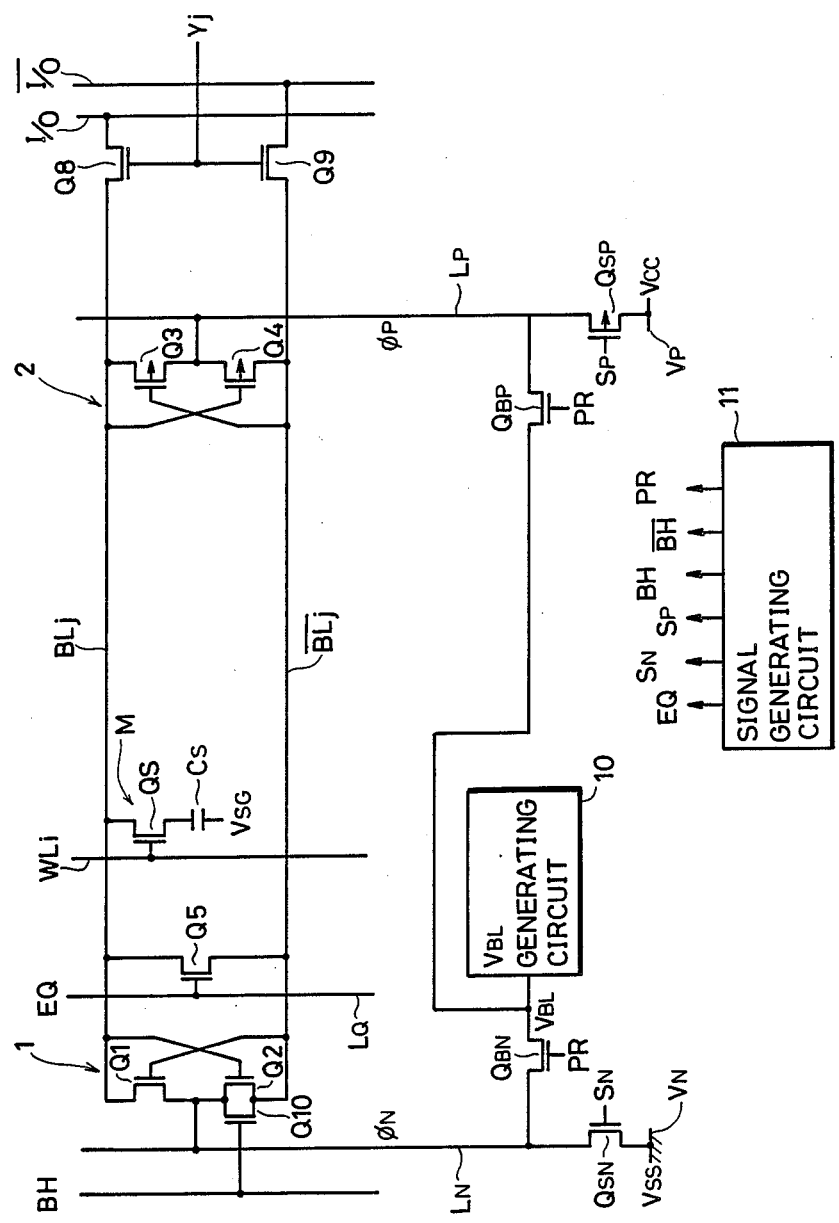
FIG. 7 is a circuit diagram showing a dynamic random access memory according to another embodiment of the present invention, where a portion of a pair of bit lines and a pair of CMOS sense amplifiers is mainly illustrated.

FIG. 7 is a circuit diagram showing a main portion of a dynamic random access memory according to another embodiment of the present invention.

In the same manner as the embodiment shown in FIG. 6, in an N channel sense amplifier 1, an N channel MOSFET Q10 for causing the bit line $\overline{BLj}$ and a line $L_N$ to be the same potential is connected therebetween. In addition, a line $L_P$ for transmitting a sense amplifier driving signal $\phi_P$ is connected to a $V_{BL}$ generating circuit 10 through an N channel MOSFET $Q_{BP}$. The FET $Q_{BP}$ has a gate receiving a precharge signal PR. Thus, when the precharge signal PR attains a high level, the lines $L_N$ and $L_P$ are connected to the $V_{BL}$ generating circuit 10. Therefore, the sense amplifier driving signals $\phi_N$ and $\phi_P$ are held at a precharge potential $V_{BL}$, i.e., $(\frac{1}{2})V_{CC}$.

Figure 8:
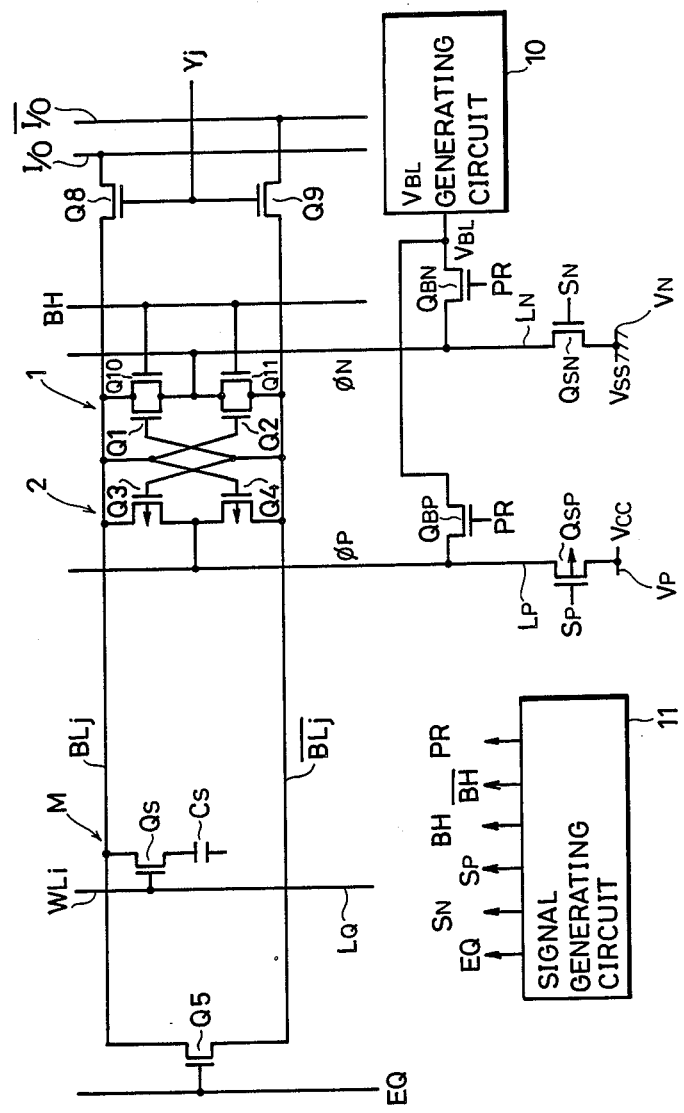
FIG. 8 is a circuit diagram showing a dynamic random access memory according to still another embodiment of the present invention, where a portion of a pair of bit lines and a pair of CMOS sense amplifiers is mainly illustrated.

FIG. 8 is a circuit diagram showing a main portion of a dynamic random access memory according to still another embodiment of the present invention.

In FIG. 8, a $V_{BL}$ generating circuit 10 is connected to a line $L_N$ through an N channel MOSFET $Q_{BN}$, and connected to a line $L_P$ through an N channel MOSFET $Q_{BP}$. Each of the FETs $Q_{BN}$ and $Q_{BP}$ has a gate receiving a precharge signal PR. In addition, in an N channel sense amplifier 1, an N channel MOSFET Q10 for causing the bit line BLj and the line $L_N$ to be the same potential is connected therebetween. An N channel MOSFET Q11 for causing the bit line $\overline{BLj}$ and the line $L_N$ to be the same potential is connected therebetween. Each of the FETs Q10 and Q11 has a gate receiving a sense amplifier pull-up signal BH.

According to the present embodiment, when the bit lines BLj and $\overline{BLj}$ are equalized by an FET Q5 and then, the sense amplifier pull-up signal BH attains a high level, the line $L_N$ for transmitting a sense amplifier driving signal $\phi_N$ is connected to the bit lines BLj and $\overline{BLj}$ through the FETs Q10 and Q11 and precharged to be $(\frac{1}{2})V_{CC}$. In addition, the precharge signal PR attains a high level, so that the $V_{BL}$ generating circuit 10 is connected to the lines $L_N$ and $L_P$. Therefore, the sense amplifier driving signals $\phi_N$ and $\phi_P$ are held at a precharge potential $V_{BL}$, i.e., $(\frac{1}{2})V_{CC}$, and the precharge potential $V_{BL}$ is supplied to the bit lines BLj and $\overline{BLj}$ through the FETs Q10 and Q11.

Figure 9:
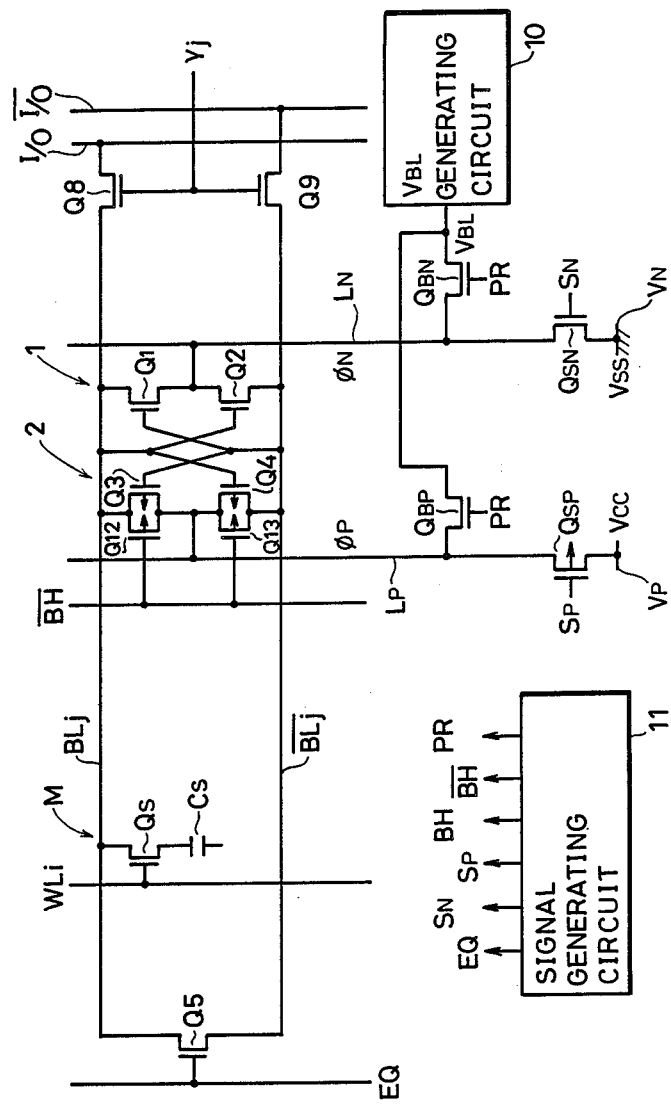
FIG. 9 is a circuit diagram showing a dynamic random access memory according to still another embodiment of the present invention, where a portion of a pair of bit lines and a pair of CMOS sense amplifiers is mainly illustrated.

As shown in FIG. 9, the FETs Q10 and Q11 in FIG. 8 may be replaced with P channel MOSFETs Q12 and Q13, which are connected between the bit lines BLj and $\overline{BLj}$ and the line $L_P$, respectively, in a P channel sense amplifier 2. In this case, each of the FETs Q12 and Q13 has a gate receiving a signal $\overline{BH}$ which is an inverted signal of the sense amplifier pull-up signal BH.

Figure 10:
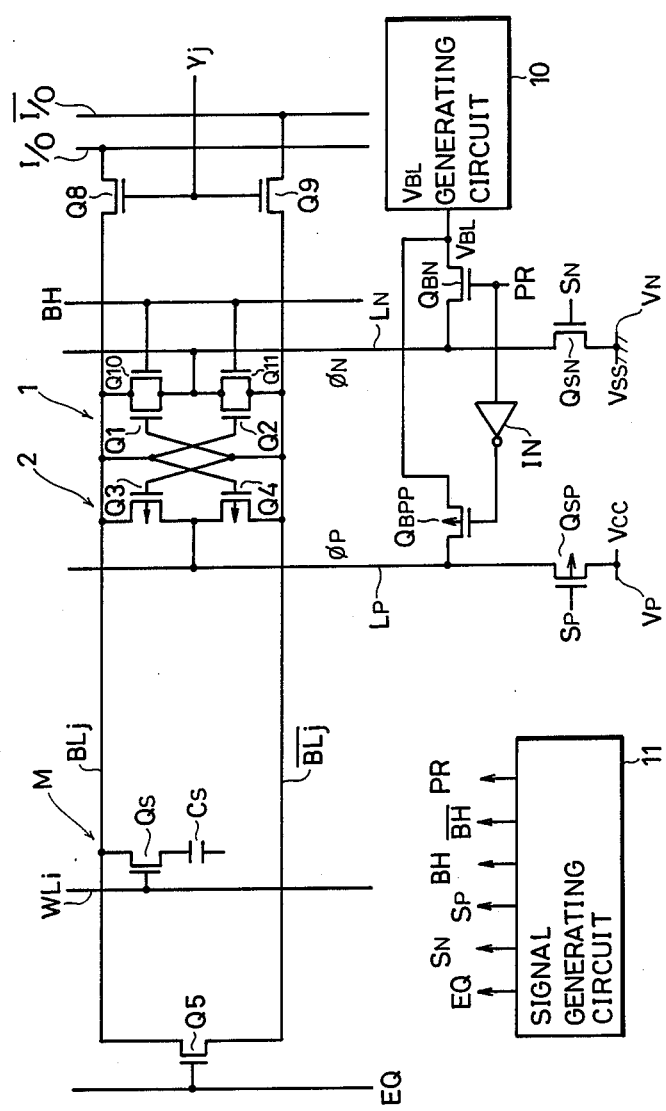
FIG. 10 is a circuit diagram showing a dynamic random access memory according to still another embodiment of the present invention, where a portion of a pair of bit lines and a pair of CMOS sense amplifiers is mainly illustrated.

As shown in FIG. 10, the N channel MOSFET $Q_{BP}$ in FIG. 8 may be replaced with a P channel MOSFET $Q_{BPP}$. In this case, the FET $Q_{BPP}$ has a gate receiving a signal which is an inverted signal of the precharge signal PR inverted by an inverter IN.

Figure 11:
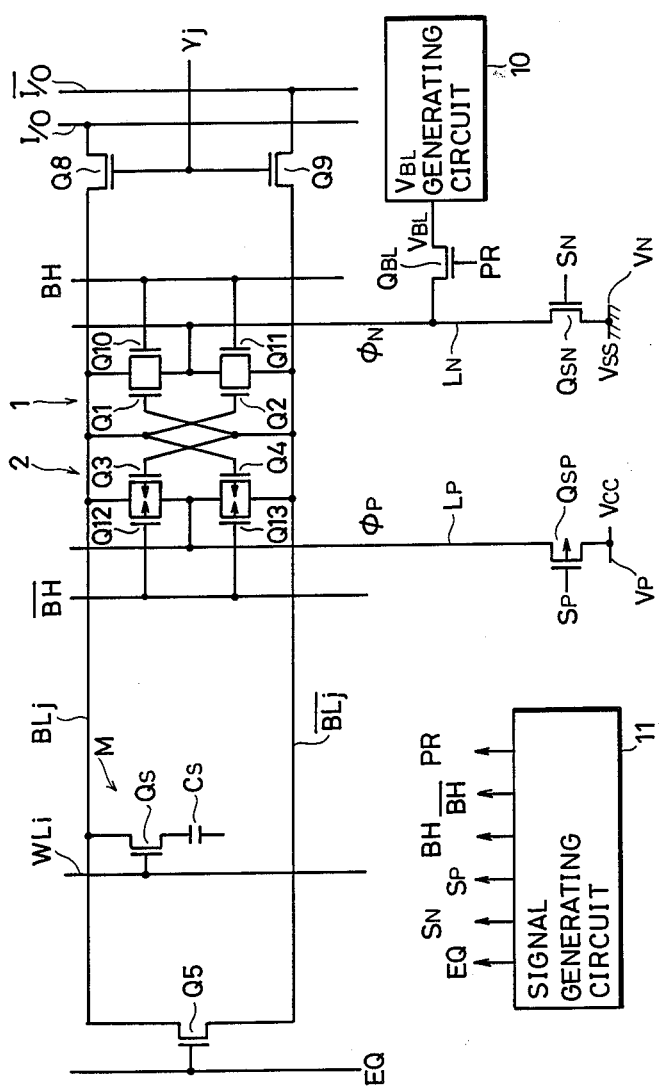
FIG. 11 is a circuit diagram showing a dynamic random access memory according to still another embodiment of the present invention, where a portion of a pair of bit lines and a pair of CMOS sense amplifiers is mainly illustrated.

FIG. 11 is a circuit diagram showing a main portion of a dynamic random access memory according to still another embodiment of the present invention.

In FIG. 11, in an N channel sense amplifier 1, an N channel MOSFET Q10 for causing a bit line BLj and a line $L_N$ to be the same potential is connected therebetween, and an N channel MOSFET Q11 for causing a bit line $\overline{BLj}$ and the line $L_N$ to be the same potential is connected therebetween. In addition, in a P channel sense amplifier 2, a P channel MOSFET Q12 for causing the bit line BLj and the line $L_P$ to be the same potential is connected therebetween, and a P channel MOSFET Q13 for causing the bit line $\overline{BLj}$ and the line $L_P$ to be the same potential is connected therebetween. Each of the FETs Q10 and Q11 has a gate receiving a sense amplifier pull-up signal BH. Each of the FETs Q12 and Q13 has a gate receiving an inverted signal $\overline{BH}$ of the sense amplifier pull-up signal BH. Furthermore, a $V_{BL}$ generating circuit 10 is connected to the line $L_N$ through an N channel MOSFET $Q_{BL}$. The FET $Q_{BL}$ has a gate receiving a precharge signal PR.

According to the present embodiment, after the bit lines BLj and $\overline{BLj}$ are equalized by an FET Q5, the sense amplifier pull-up signal BH attains a high level and at the same time, the sens amplifier pull-up signal $\overline{BH}$ attains a low level, so that the line $L_N$ is precharged to be $(\frac{1}{2})V_{CC}$ through the FETs Q10 and Q11 and the line $L_P$ is precharged to be $(\frac{1}{2})V_{CC}$ through the FETs Q12 and Q13. In addition, the precharge signal PR attains a high level, so that the $V_{BL}$ generating circuit 10 is connected to the line $L_N$. Therefore, a sense amplifier driving signal $\phi_N$ is held at a precharge potential $V_{BL}$, i.e., $(\frac{1}{2})V_{CC}$. At that time, the potentials on the bit lines BLj and $\overline{BLj}$ are held at the precharge potential $V_{BL}$ through the FETs Q10 and Q11. Furthermore, the potential on the line $L_P$, that is, a sense amplifier driving signal $\phi_P$ is held at the precharge potential $V_{BL}$ through the FETs Q12 and Q13.

Figure 12:
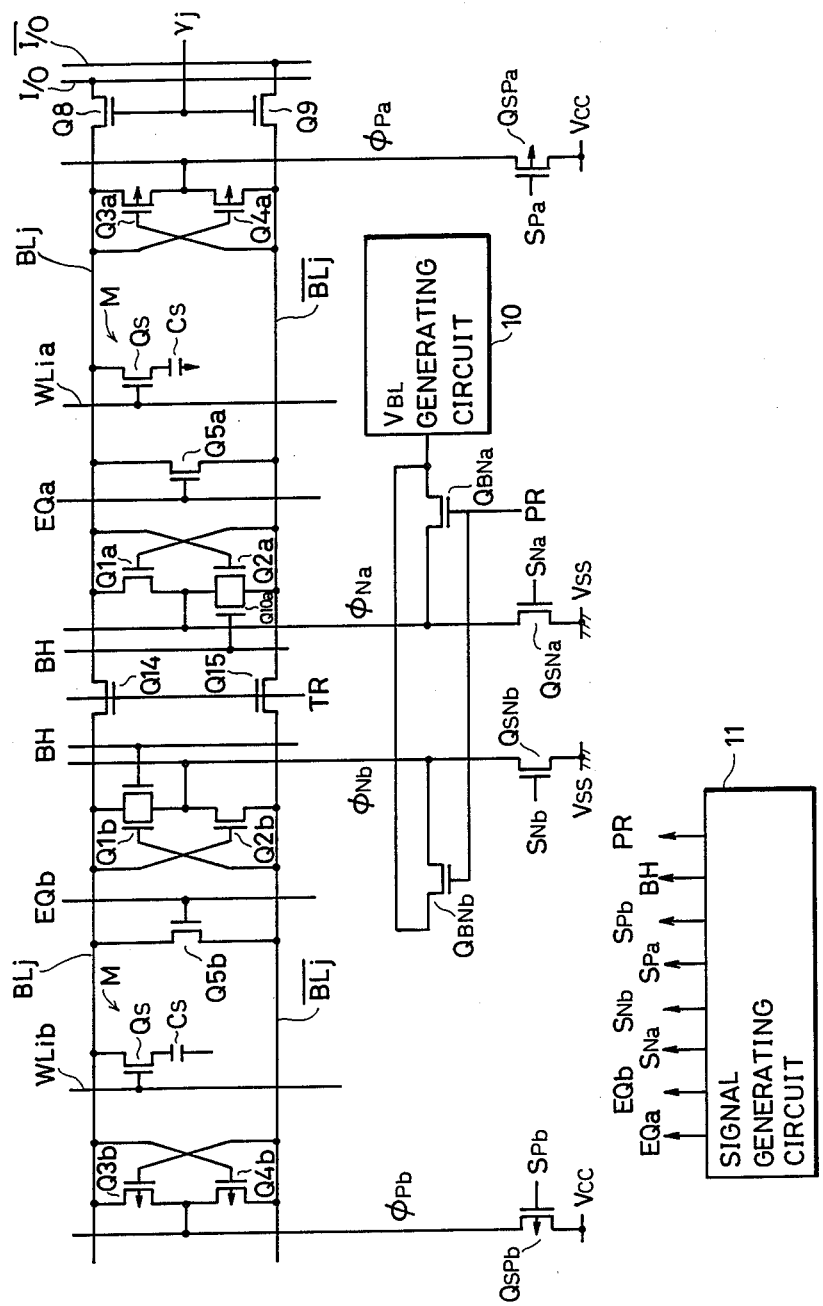
FIG. 12 is a circuit diagram showing a dynamic random access memory according to still another embodiment of the present invention, where a portion of a pair of bit lines and a pair of CMOS sense amplifiers which are divided into two, respectively, is mainly illustrated.

The present invention is applied to the case in which each of the bit lines BLj and $\overline{BLj}$ is divided into a plurality of portions. In FIG. 12, each of the bit lines BLj and $\overline{BLj}$ is divided into two, for example. The divided bit lines BLja and BLjb are connected to each other through an MOSFET Q14, and the divided bit lines $\overline{BLja}$ and $\overline{BLjb}$ are connected to each other through an MOSFET Q15. The FETs Q14 and Q15 are turned on by a signal TR. A precharge potential $V_{BL}$ is supplied to the bit line pair BLja and $\overline{BLja}$ through FETs Q5a and Q10a, and the precharge potential $V_{BL}$ is supplied to the bit line pair BLjb and $\overline{BLjb}$ through FETs Q5b and Q10b. In order to supply the precharge potential $V_{BL}$ to the bit line pair divided into two, six MOSFETs have been conventionally required for one bit line pair. On the other hand, according to the present embodiment, the precharge potential can be supplied by four MOSFETs.

An FET for connecting the bit lines BLj and $\overline{BLj}$ to the line $L_N$ or $L_P$ and an FET for connecting the $V_{BL}$ generating circuit 10 to the line $L_N$ or $L_P$ may comprise an MOSFET having a different conductivity type from that in the above described embodiment or another switching means.

Although in the above described embodiment, the equalize signal EQ, the sense amplifier pull-up signal BH and the precharge signal PR are different signals, a part or all of the signals may be the same signal.

However, if the potentials on the bit line pair BLj and $\overline{BLj}$ become $(\frac{1}{2})V_{CC}$ and then, the bit line pair BLj and $\overline{BLj}$ is connected to the $V_{BL}$ generating circuit 10 through the line $L_P$ or $L_N$, an output voltage of the $V_{BL}$ generating circuit 10 does not vary from $(\frac{1}{2})V_{CC}$.

Thus, it is desirable that the rising time points of the equalize signal EQ, the sense amplifier pull-up signal BH and the precharge signal PR are delayed, as in the above described embodiment.

Particularly, if the $V_{BL}$ generating circuit 10 is adapted to hardly consume current when the output voltage is $(\frac{1}{2})V_{CC}$, consumed current can be decreased by delaying the rising time of the precharge signal PR.

Figure 13:
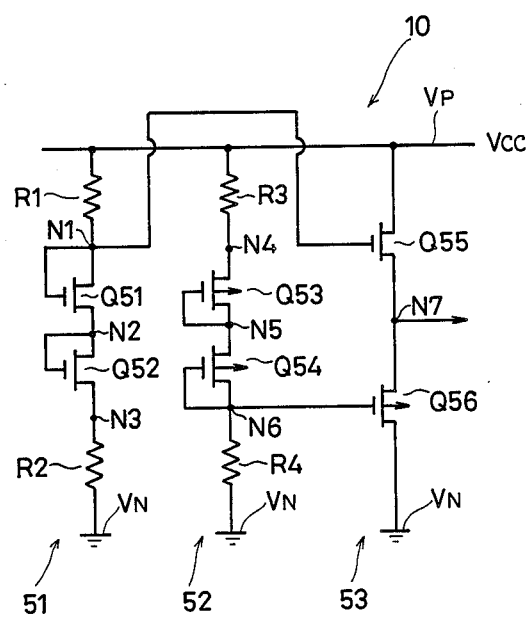
FIG. 13 is a circuit diagram showing an example of a $V_{BL}$ generating circuit.

FIG. 13 illustrates an example of a structure of a $V_{BL}$ generating circuit 10.

In FIG. 13, a first reference voltage generating circuit 51 comprises a resistor R1, an N channel MOSFET Q51, an N channel MOSFET Q52 and a resistor R2 which are connected in series between a power supply line $V_P$ of a potential $V_{CC}$ and a grounding conductor $V_N$ of a potential 0 V. The FET Q51 has a gate connected to a node N1 of the resistor R1 and the FET Q51. The FET Q52 has a gate connected to a node N2 of the FET Q51 and the FET Q52. A second reference voltage generating circuit 52 comprises a resistor R3, a P channel MOSFET Q53, a P channel MOSFET Q54 and a resistor R4 which are connected in series between the power supply line $V_P$ and the grounding conductor $V_N$. The FET Q53 has a gate connected to a node N5 of the FET Q53 and the FET Q54. The FET Q54 has a gate connected to a node N6 of the FET Q54 and the resistor R4. An output stage 53 comprises an N channel MOSFET Q55 and a P channel MOSFET Q56 connected in series between the power supply line $V_P$ and the grounding conductor $V_N$. The FET Q55 has a gate connected to the node N1, and the FET Q56 has a gate connected to the node N6. A voltage of $(\frac{1}{2})V_{CC}$ is outputted from a node N7 of the FET Q55 and the FET Q56.

In the $V_{BL}$ generating circuit 10, while the output voltage is $(\frac{1}{2})V_{CC}$, current flowing through the output stage 53 is 0. If the output voltage deviates from $(\frac{1}{2})V_{CC}$, the FETs Q55 or Q56 are rendered conductive, so that the output voltage is returned to $(\frac{1}{2})V_{CC}$.

According to the present invention, the $V_{BL}$ generating circuit 10 is used for compensating for variation from $(\frac{1}{2})V_{CC}$ in the potentials of bit line pairs and interconnections for transmitting sense amplifier driving signals from $(\frac{1}{2})V_{CC}$ rather than for setting to $(\frac{1}{2})V_{CC}$ the potentials of the bit line pairs and the above described interconnections.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory comprising:
   a plurality of word lines,
   a plurality of bit line pairs arranged to intersect with said word lines,
   a plurality of memory cells provided at intersections of said word lines and said bit lines,
   equalize signal generating means for generating an equalize signal commanding equalizing of said plurality of bit line pairs,
   a plurality of equalizing means each provided for each of said bit line pairs and responsive to said equalize signal for equalizing each of said bit line pairs,
   a plurality of first sense amplifiers each connected to each of said bit line pairs for amplifying the potential difference between the bit line pair,
   each of said first sense amplifiers comprising a first N channel FET and a second N channel FET,
   first sense amplifier driving signal generating means for generating a first sense amplifier driving signal for driving said first sense amplifiers,
   said first sense amplifiers being operated in response to said first sense amplifier driving signal,
   a plurality of second sense amplifiers each connected to each of said bit line pairs for amplifying the potential difference between the bit line pair,
   each of said second sense amplifiers comprising a first P channel FET and a second P channel FET,
   second sense amplifier driving signal generating means for generating a second sense amplifier driving signal for driving said second sense amplifiers,
   said second sense amplifiers being operated in response to said second sense amplifier driving signal,
   a first driving signal line connected to said first sense amplifiers so that said first sense amplifier driving signal is applied to said first sense amplifiers through said first driving signal line,
   a second driving signal line connected to said second sense amplifiers so that said second sense amplifier driving signal is applied to said second sense amplifiers through said second driving signal line,
   connecting means each provided for each of said bit line pairs for connecting at least one of the bit line pair to at least one of said first driving signal line and said second driving signal line,
   activating signal generating means for generating an activating signal for activating said connecting means,
   said connecting means being operated in response to said activating signal,
   a first potential source for generating a first potential corresponding to a first logical level,
   a second potential source for generating a second potential corresponding to a second logical level, and
   potential holding means for holding the potentials on said first driving signal line and said second driving signal line at an intermediate potential between said first potential and said second potential.

2. A dynamic random access memory according to claim 1, wherein said potential holding means comprises intermediate potential generating means for generating the intermediate potential between said first potential and said second potential.

3. A dynamic random access memory according to claim 1, wherein said first potential comprises a predetermined power supply potential and said second potential comprises a ground potential.

4. A dynamic random access memory according to claim 2, wherein said connecting means comprises a first connecting FET connected between one line of said bit line pair and one of said first driving signal line and said second driving signal line and responsive to said activating signal to be rendered conductive.

5. A dynamic random access memory according to claim 4, wherein said potential holding means comprises
   potential holding signal generating means for generating a potential holding signal commanding holding of the potential,
   a potential holding FET connected between an output of said intermediate potential generating means and one of said first driving signal line and said second driving signal line and responsive to said potential holding signal to be rendered conductive,
   a second connecting FET connected between one line of said bit line pair and the other of said first driving signal line and said second driving signal line and responsive to said activating signal to be rendered conductive.

6. A dynamic random access memory according to claim 5, wherein said potential holding means further comprises a third connecting FET connected between other line of said bit line pair and the other of said first driving signal line and said second driving signal line and responsive to said activating signal to be rendered conductive.

7. A dynamic random access memory according to claim 4, wherein said potential holding means comprises,
   potential holding signal generating means for generating a potential holding signal commanding holding of the potential,
   a first potential holding FET connected between an output of said intermediate potential generating means and said first driving signal line and responsive to said potential holding signal to be rendered conductive, and
   a second potential holding FET connected between an output of said intermediate potential generating means and said second driving signal line and responsive to said potential holding signal to be rendered conductive.

8. A dynamic random access memory according to claim 2, wherein said connecting means comprises
   a first connecting FET connected between one line of said bit line pair and one of said first driving signal line and said second driving signal line and responsive to said activating signal to be rendered conductive, and
   a second connecting FET connected between other line of said bit line pair and one of said first driving signal line and said second driving signal line and responsive to said activating signal to be rendered conductive.

9. A dynamic random access memory according to claim 8, wherein said potential holding means comprises
   potential holding signal generating means for generating a potential holding signal commanding holding of the potential,
   a first potential holding FET connected between an output of said intermediate potential generating means and said first driving signal line and responsive to said potential holding signal to be rendered conductive, and
   a second potential holding FET connected between an output of said intermediate potential generating means and said second driving signal line and responsive to said potential holding signal to be rendered conductive.

10. A dynamic random access memory according to claim 2, wherein said connecting means comprises
    a first connecting FET connected between one line of said bit line pair and said first driving signal line and responsive to said activating signal to be rendered conductive,
    a second connecting FET connected between other line of said bit line pair and said first driving signal line and responsive to said activating signal to be rendered conductive,
    a third connecting FET connected between said one line of said bit line pair and said second driving signal line and responsive to said activating signal to be rendered conductive, and
    a fourth connecting FET connected between said other line of said bit line pair and said second driving signal line and responsive to said activating signal to be rendered conductive.

11. A dynamic random access memory according to claim 10, wherein said potential holding means comprises
    potential holding signal generating means for generating a potential holding signal commanding holding of the potential, and
    a first potential holding FET connected between an output of said potential generating means and one of said first driving signal line and said second driving signal line and responsive to said potential holding signal to be rendered conductive.

12. A dynamic random access memory according to claim 1, wherein said activating signal generating means generates said activating signal at the time point later than the time point when the equalize signal is generated from said equalize signal generating means.

13. A dynamic random access memory according to claim 1, wherein said potential holding means is operated at the time point later than the time point when the activating signal is generated by said activating signal generating means.

14. A dynamic random access memory according to claim 2, wherein said intermediate potential generating means comprises an output stage which does not operate when the output voltage is at said intermediate potential and operates to return the output voltage to said intermediate potential when the output voltage deviates from said intermediate potential.

15. A dynamic random access memory according to claim 14, wherein said intermediate potential generating means comprises
    an output terminal,
    first reference potential generating means comprises first resistor means, a first N channel FET, a second N channel FET and second resistor means which are connected in series between said first potential source and said second potential source for generating a potential, the level of which is shifted, by a threshold voltage of the N channel FET, as compared with said first potential,
    second reference potential generating means comprising third resistor means, a third P channel FET, a fourth P channel FET and fourth resistor means which are connected in series between said first potential source and said second potential source for generating a potential, the level of which is shifted, by a threshold voltage of the P channel FET, as compared with said second potential, and
    an output stage comprising an outputting N channel FET connected between said first potential source and said output terminal and having a gate coupled to an output from said first reference potential generating means and an outputting P channel FET connected between said second potential source and said output terminal and having a gate coupled to an output from said second reference potential generating means.

16. A dynamic random access memory comprising:
    a plurality of word lines,
    a plurality of bit line pairs arranged to intersect with said word lines,
    a plurality of memory cells provided at intersections between said word lines and said bit lines,
    a first potential source for generating a first potential corresponding to a first logical level,
    a second potential source for generating a second potential corresponding to a second logical level, a plurality of first sense amplifiers each connected to each of said bit line pairs for causing the bit line at a lower potential of the bit line pair to be said second potential, each of said first sense amplifiers comprising a first N channel FET and a second N channel FET, first sense amplifier driving signal generating means for generating a first sense amplifier driving signal for driving said first sense amplifiers, said first sense amplifiers being operated in response to said first sense amplifier driving signal, a plurality of second sense amplifiers each connected to each of said bit line pairs for causing the bit line at a higher potential of the bit line pair to be said first potential, each of said second sense amplifiers comprising a first P channel FET and a second P channel FET, second sense amplifier driving signal generating means for generating a second sense amplifier driving signal for driving said second sense amplifiers, said second sense amplifiers being operated in response to said second sense amplifier driving signal, a first driving signal line connected to said first sense amplifiers so that said first sense amplifier driving signal is applied to said first sense amplifiers through said first driving signal line, a second driving signal line connected to said second sense amplifiers so that said second sense amplifier driving signal is applied to said second sense amplifiers through said second driving signal line, a plurality of equalizing means each provided for each of said bit line pairs for equalizing the bit line pair to be an intermediate potential between said first potential and said second potential after operation of said first sense amplifiers and said second sense amplifiers, connecting means each provided for each of said bit line pairs for electrically connecting at least one of the bit line pair to at least one of said first driving signal line and said second driving signal line simultaneously with or after equalizing by said equalizing means, and potential variation compensating means for compensating for variation in potentials on said first driving signal line and said second driving signal line after operation of said connecting means.

* * * * *